(12) United States Patent
Lee et al.

(10) Patent No.: US 11,322,475 B2
(45) Date of Patent: May 3, 2022

(54) STACK SEMICONDUCTOR PACKAGES HAVING WIRE-BONDING CONNECTION STRUCTURE

(71) Applicant: SK hynix Inc., Icheon-si (KR)

(72) Inventors: Jae Hoon Lee, Icheon-si (KR); Ji Yeong Yoon, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 84 days.

(21) Appl. No.: 16/591,072

(22) Filed: Oct. 2, 2019

(65) Prior Publication Data

US 2020/0286856 A1     Sep. 10, 2020

(30) Foreign Application Priority Data

Mar. 4, 2019  (KR) .................. 10-2019-0024866

(51) Int. Cl.
*H01L 23/00* (2006.01)
*H01L 23/538* (2006.01)
*H01L 23/495* (2006.01)

(52) U.S. Cl.
CPC ........ *H01L 24/85* (2013.01); *H01L 23/49513* (2013.01); *H01L 23/5389* (2013.01); *H01L 24/04* (2013.01)

(58) Field of Classification Search
CPC .............. H01L 23/13; H01L 23/49513; H01L 23/5386; H01L 23/5389; H01L 24/85; H01L 24/04; H01L 24/16; H01L 24/48; H01L 25/0652
See application file for complete search history.

(56) References Cited

U.S. PATENT DOCUMENTS

| 7,846,768 B2 | 12/2010 | Kim et al. |
| 7,989,939 B2 | 8/2011 | Hwang et al. |
| 2003/0205801 A1* | 11/2003 | Baik ................. H01L 23/49575 257/686 |
| 2013/0015590 A1* | 1/2013 | Haba ..................... H01L 23/481 257/778 |
| 2013/0336039 A1* | 12/2013 | Frans ..................... G11C 5/063 365/51 |

* cited by examiner

*Primary Examiner* — Vongsavanh Sengdara
(74) *Attorney, Agent, or Firm* — William Park & Associates Ltd.

(57) ABSTRACT

A semiconductor package includes a package substrate having a hole pattern including a first through hole extending in a first direction and a second through hole extending in a second direction substantially perpendicular to the first direction, at least one first semiconductor chip disposed on the package substrate to overlap with the first through hole, at least one second semiconductor chip disposed on the package substrate to overlap with the second through hole, first bonding wires passing through the first through hole to electrically connect the at least one first semiconductor chip to the package substrate, and second bonding wires passing through the second through hole to electrically connect the at least one second semiconductor chip to the package substrate.

16 Claims, 16 Drawing Sheets

STACK SEMICONDUCTOR PACKAGES HAVING WIRE-BONDING CONNECTION STRUCTURE

CROSS-REFERENCE TO RELATED APPLICATIONS

The present application claims priority under 35 U.S.C. 119(a) to Korean Application No. 10-2019-0024866, filed on Mar. 4, 2019, which is incorporated herein by references in its entirety.

BACKGROUND

1. Technical Field

The present disclosure relates to semiconductor packages and, more particularly, to stack semiconductor packages having a wire-bonding connection structure.

2. Related Art

Recently, compact and highly integrated semiconductor products have been developed to process a large amount of data through high speeds. Meanwhile, there may be limitations in improving performance of semiconductor chips due to a difficulty in developing the fabrication process of the semiconductor chips. Thus, various techniques for increasing the number of semiconductor chips employed in a single semiconductor package have been proposed to improve the data processing performance of an electronic system including the semiconductor package.

A lot of effort has been focused on developing a technique for stacking semiconductor chips on a package substrate to increase the number of semiconductor chips in a semiconductor package. The semiconductor chips stacked on the package substrate may be electrically connected to the package substrate by connection members such as bonding wires or bumps.

SUMMARY

According to an embodiment, there is provided a semiconductor package. The semiconductor package may include a package substrate having a hole pattern including a first through hole extending in a first direction and a second through hole extending in a second direction substantially perpendicular to the first direction, at least one first semiconductor chip disposed on the package substrate to overlap with the first through hole, at least one second semiconductor chip disposed on the package substrate to overlap with the second through hole, first bonding wires passing through the first through hole to electrically connect the at least one first semiconductor chip to the package substrate, and second bonding wires passing through the second through hole to electrically connect the at least one second semiconductor chip to the package substrate.

According to another embodiment, there is provided a semiconductor package. The semiconductor package may include a package substrate configured to have a hole pattern including a first through hole and a second through hole intersecting each other and configured to have first to fourth substrate regions defined by the hole pattern, two first semiconductor chips disposed on a first surface of the package substrate to cross over the first through hole, two second semiconductor chips disposed on the two semiconductor chips to cross over the second through hole, first bonding wires passing through the first through hole to electrically connect the two first semiconductor chips to the package substrate, and second bonding wires passing through the second through hole to electrically connect the two second semiconductor chips to the package substrate. One of the two first semiconductor chips is disposed to overlap the first and second substrate regions, and the other of the two first semiconductor chips is disposed to overlap the third and fourth substrate regions. One of the two second semiconductor chips is disposed to overlap the first and third substrate regions, and the other of the two second semiconductor chips is disposed to overlap the second and fourth substrate regions.

According to another embodiment, there is provided a semiconductor package module including a plurality of semiconductor packages vertically stacked. Each of the plurality of semiconductor packages includes a package substrate having a hole pattern including a first through hole extending in a first direction and a second through hole extending in a second direction substantially perpendicular to the first direction, at least one first semiconductor chip disposed on the package substrate to overlap with the first through hole, at least one second semiconductor chip disposed on the package substrate to overlap with the second through hole, first bonding wires passing through the first through hole to electrically connect the at least one first semiconductor chip to the package substrate, and second bonding wires passing through the second through hole to electrically connect the at least one second semiconductor chip to the package substrate. An upper package of two adjacent packages of the plurality of stacked semiconductor packages is disposed on a lower package of the two adjacent packages such that the first and second semiconductor chips of the lower package face the package substrate of the upper package. The upper package is electrically connected to the lower package by a bonding wire.

According to another embodiment, there is provided a semiconductor package module including a plurality of semiconductor packages vertically stacked. Each of the plurality of semiconductor packages includes a package substrate having a hole pattern including a first through hole extending in a first direction and a second through hole extending in a second direction substantially perpendicular to the first direction, at least one first semiconductor chip disposed on the package substrate to overlap with the first through hole, at least one second semiconductor chip disposed on the package substrate to overlap with the second through hole, first bonding wires passing through the first through hole to electrically connect the at least one first semiconductor chip to the package substrate, and second bonding wires passing through the second through hole to electrically connect the at least one second semiconductor chip to the package substrate. An upper package of two adjacent packages of the plurality of stacked semiconductor packages is disposed on a lower package of the two adjacent packages such that the first and second semiconductor chips of the lower package face the first and second semiconductor chips of the upper package. The upper package is electrically connected to the lower package by a bonding wire.

DETAILED DESCRIPTION

Figure 1:
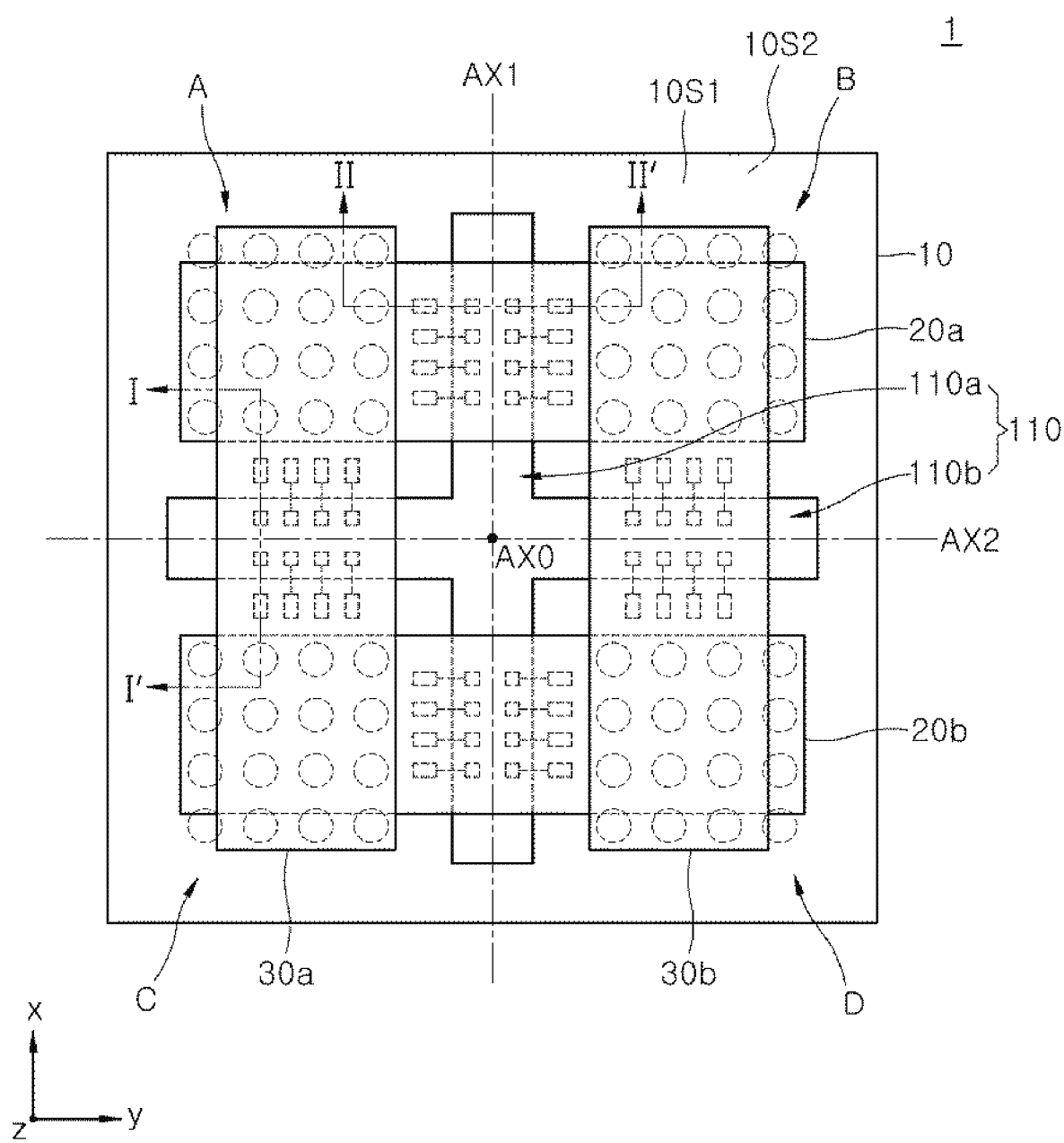
FIG. 1 is a plan view illustrating a semiconductor package according to an embodiment of the present disclosure.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence. It will also be understood that when an element or layer is referred to as being "on" another element or layer, the element or layer may be in direct contact with the other element or layer, or intervening elements or layers may be present.

In the following embodiments, a semiconductor package may include electronic devices such as semiconductor chips. The semiconductor chips may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor chips may be referred to as semiconductor dies.

The semiconductor package may include a printed circuit board (PCB) on which the semiconductor chip is mounted. The PCB may include at least one layer of integrated circuit patterns and may be referred as a package substrate in the present specification. A connection technique such as a wire bonding technique may be used for communication between the package substrate and the semiconductor chip.

The semiconductor package may be employed in various communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

In the present specification, an upper chip and a lower chip of a plurality of first semiconductor chips may indicate two first semiconductor chips which are respectively disposed on two different regions of a single plane. Similarly, a left chip and a right chip of a plurality of second semiconductor chips may indicate two second semiconductor chips which are respectively disposed on two different regions of a single plane.

Figure 2A:
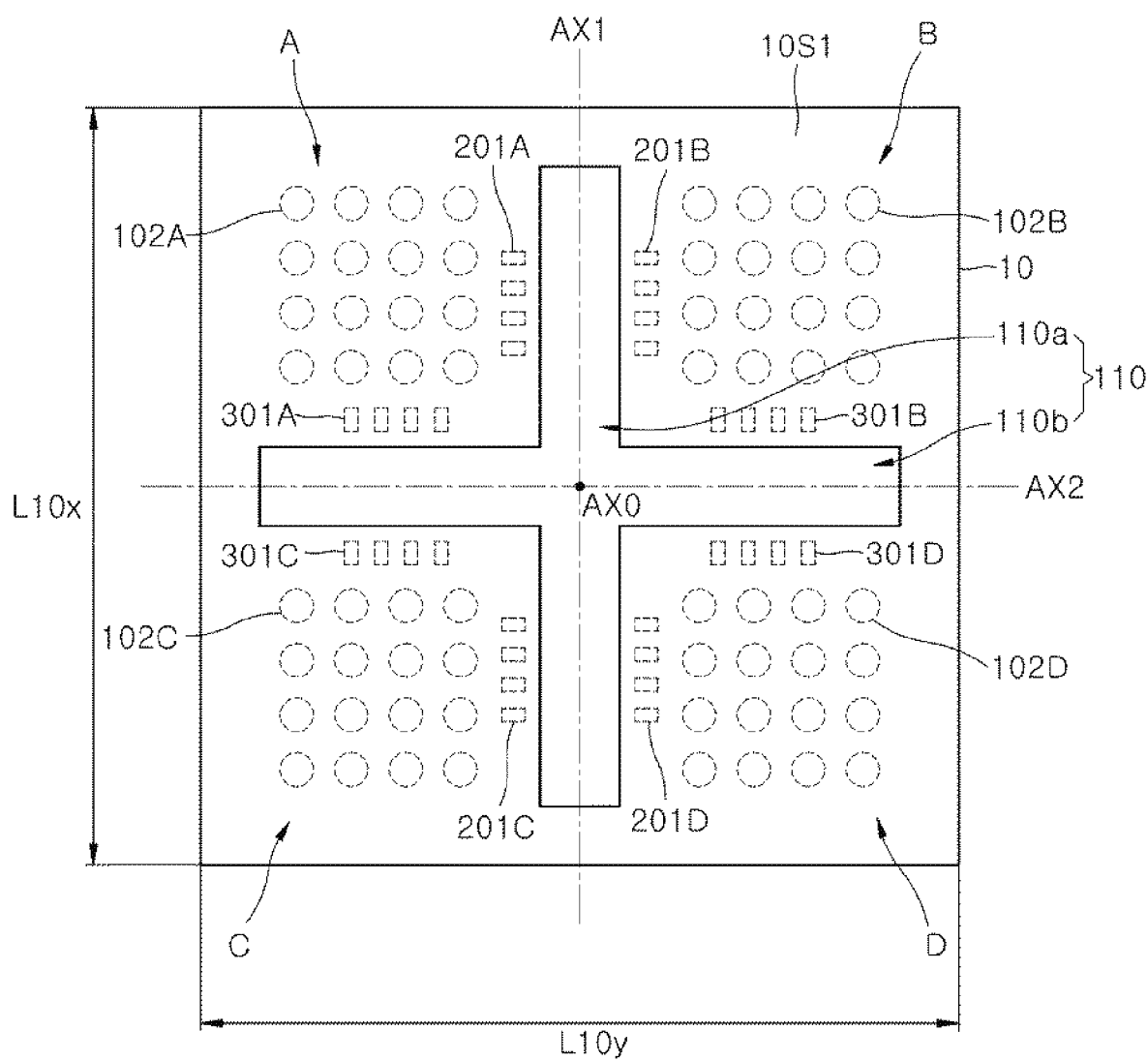
FIGS. 2A and 2B are plan views of a package substrate on a first surface and a second surface of the package substrate, respectively, included in the semiconductor package of FIG. 1.
Figure 2B:
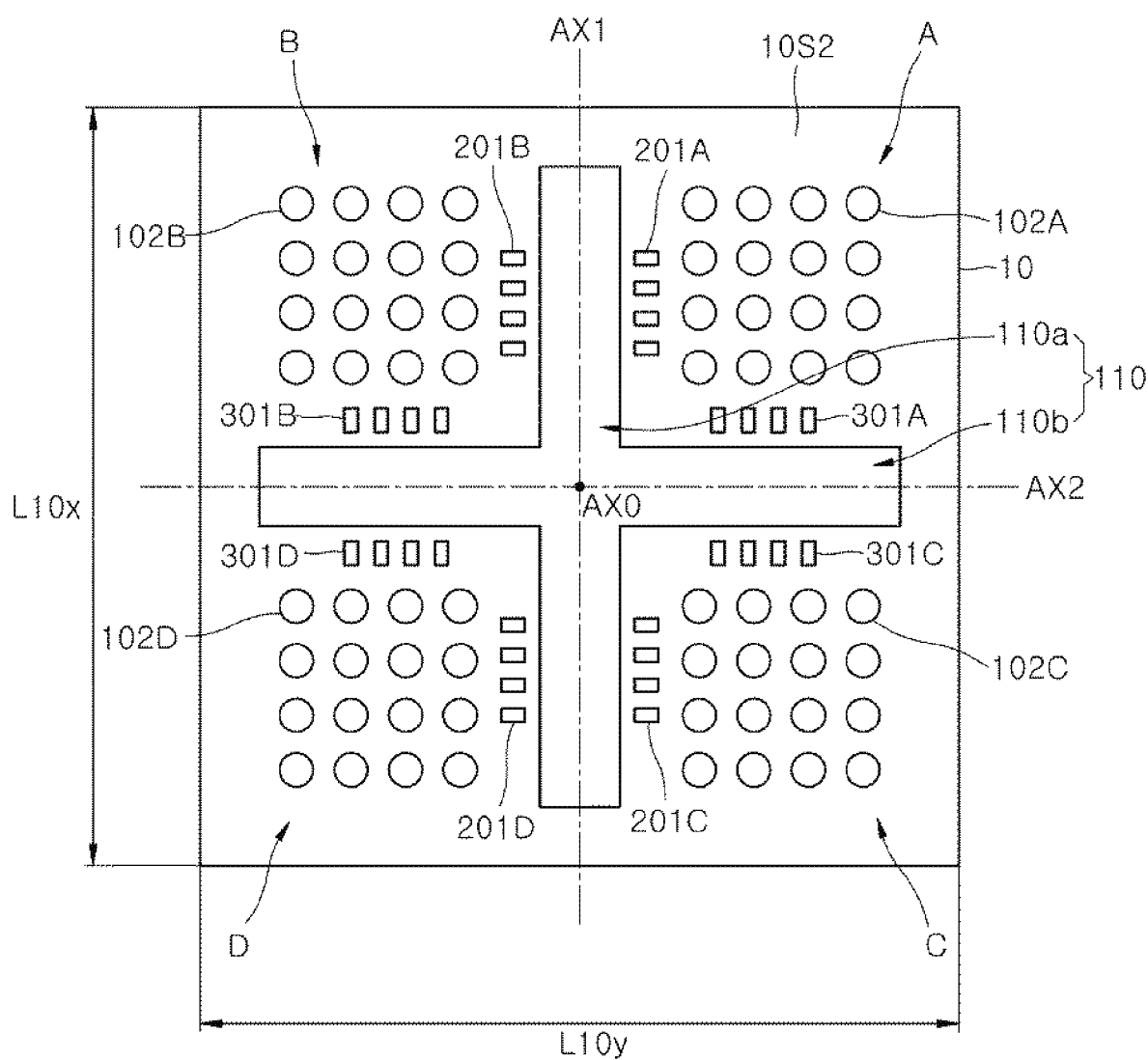
Figure 3:
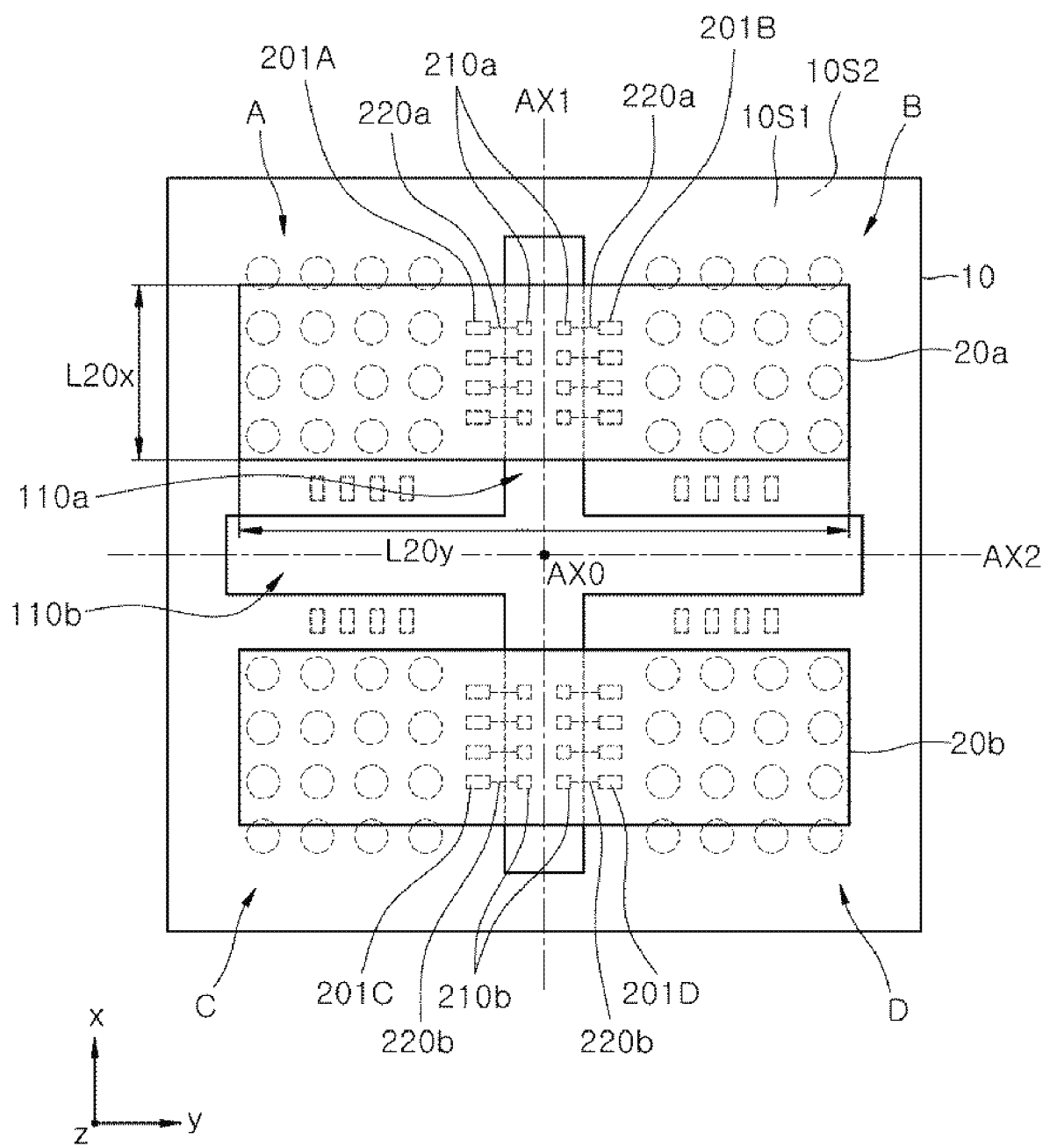
FIG. 3 is a plan view illustrating a connection member between a package substrate and first semiconductor chips included in the semiconductor package of FIG. 1.
Figure 4:
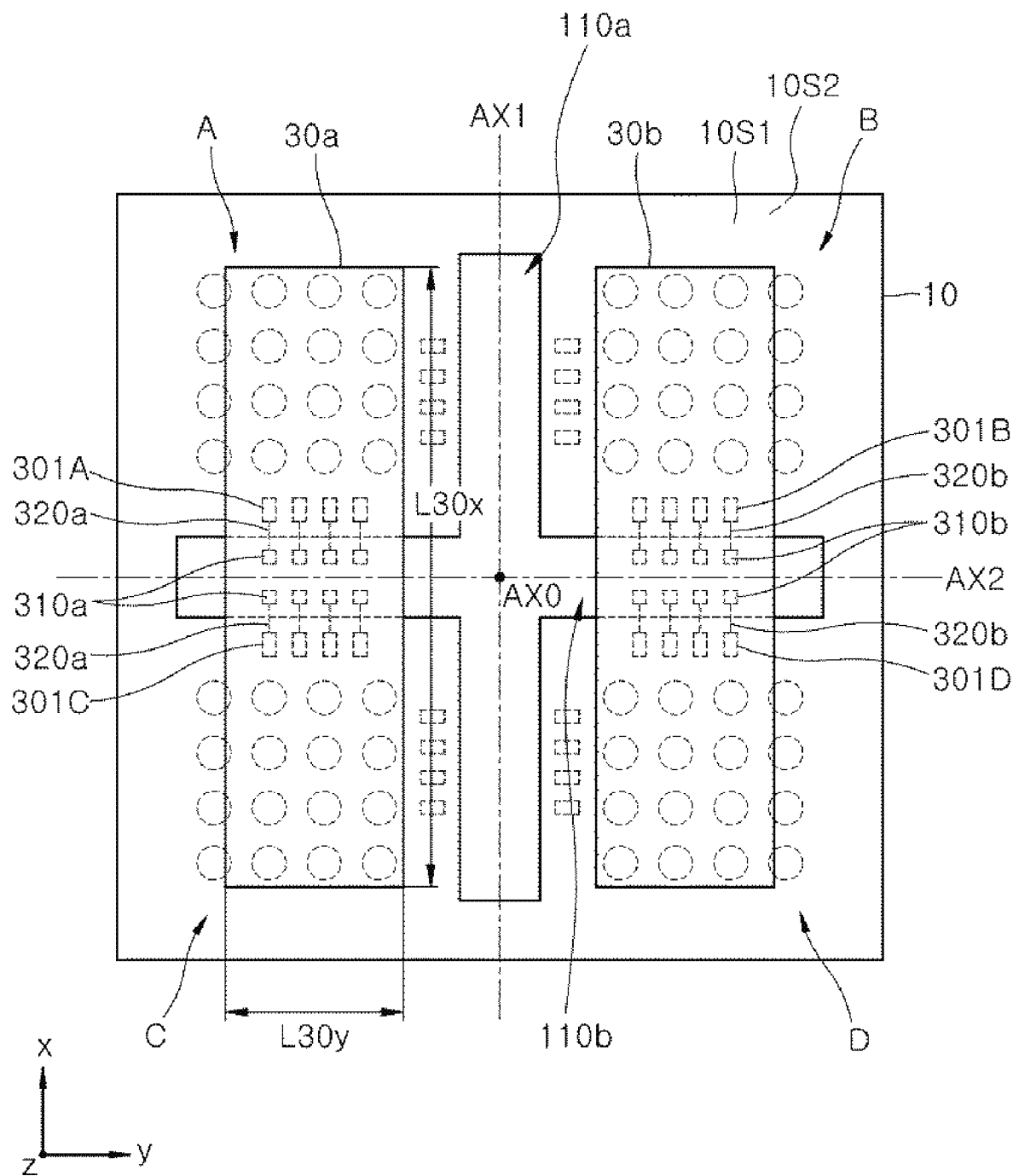
FIG. 4 is a plan view illustrating a connection member between a package substrate and second semiconductor chips included in the semiconductor package of FIG. 1.

FIG. 1 is a plan view illustrating a semiconductor package 1 according to an embodiment of the present disclosure. FIGS. 2A and 2B are plan views of a package substrate 10 on a first surface 10S1 and a second surface 10S2 of the package substrate 10, respectively, included in the semiconductor package 1 of FIG. 1. FIG. 3 is a plan view illustrating a connection member between a package substrate 10 and first semiconductor chips 20a and 20b included in the semiconductor package 1 of FIG. 1. FIG. 4 is a plan view illustrating a connection member between a package substrate 10 and second semiconductor chips 30a and 30b included in the semiconductor package 1 of FIG. 1. The first semiconductor chips 20a and 20b included in the semiconductor package 1 are not illustrated in FIG. 4 to avoid complexity of the drawing.

Referring to FIG. 1, the semiconductor package 1 may include the package substrate 10 having a hole pattern 110. The hole pattern 110 may include a first through hole 110a and a second through hole 110b. In addition, the semiconductor package 1 may include the first semiconductor chips 20a and 20b disposed on the package substrate 10 to overlap with the first through hole 110a and the second semiconductor chips 30a and 30b disposed on the package substrate 10 to overlap with the second through hole 110b. For example, the first semiconductor chips 20a and 20b may be disposed to have a major axis parallel with a direction (e.g., a y-axis direction) which is perpendicular to a first central axis AX1 of the package substrate 10 in a plan view. The second semiconductor chips 30a and 30b may be disposed to have a major axis parallel with a direction (e.g., an x-axis direction) which is perpendicular to a second central axis AX2 of the package substrate 10 in a plan view.

In an embodiment, the first semiconductor chips 20a and 20b and the second semiconductor chips 30a and 30b may be sequentially stacked on the package substrate 10. As illustrated in the drawings, the first semiconductor chips 20a and 20b may be disposed on the package substrate 10, and the second semiconductor chips 30a and 30b may be disposed on the first semiconductor chips 20a and 20b opposite to the package substrate 10. Thus, the semiconductor package 1 may include four semiconductor chips stacked on the package substrate 10.

In an embodiment, each of the second semiconductor chips 30a and 30b may be disposed to overlap with a portion of the first semiconductor chip 20a and a portion of the first semiconductor chip 20b in a direction perpendicular to a first surface 10S1 of the package substrate 10. In an embodiment, the first semiconductor chips 20a and 20b may have the same size. In other embodiments, the first semiconductor chips 20a and 20b may have different sizes from each other. In an embodiment, the second semiconductor chips 30a and 30b may have the same size. In other embodiments, the second semiconductor chips 30a and 30b may have different sizes from each other. In an embodiment, the first and second semiconductor chips 20a, 20b, 30a and 30b may have the same size. In other embodiments, the first and second semiconductor chips 20a, 20b, 30a and 30b may all have different sizes from each other.

Referring to FIG. 1, the first semiconductor chips 20a and 20b may be disposed on the first surface 10S1 of the package substrate 10 to be parallel with the second central axis AX2 of the package substrate 10. The second semiconductor chips 30a and 30b may be disposed above the first semiconductor chips 20a and 20b to be parallel with the first central axis AX1 of the package substrate 10. That is, the second semiconductor chips 30a and 30b may be disposed to intersect the first semiconductor chips 20a and 20b in a plan view. As a result, each of the second semiconductor chips 30a and 30b may be disposed to have two overlapping regions that overlap with the first semiconductor chips 20a and 20b.

As illustrated in FIG. 1, the four overlapping regions of the second semiconductor chips 30a and 30b may be located at first to fourth substrate regions A, B, C and D, respectively. For example, the four overlapping regions of the second semiconductor chips 30a and 30b may be symmetric with respect to the first central axis AX1. The four overlapping regions of the second semiconductor chips 30a and 30b may also be symmetric with respect to the second central axis AX2. As describe above, the second semiconductor chips 30a and 30b may be disposed to have the overlapping regions with the first semiconductor chips 20a and 20b, thereby effectively forming a wire-bonding structure with the first and second through holes 110a and improving the integration density of the semiconductor package 1. Referring to FIGS. 1, 2A, 2B, 3 and 4, the package substrate 10 may correspond to an interconnection structure for electrically and signally connecting the first and second semiconductor chips 20a, 20b, 30a and 30b to an external device. For example, the package substrate 10 may be a printed circuit board (PCB), an interposer or a flexible PCB. The package substrate 10 may include a substrate body comprised of an insulation material or a dielectric material and conductive trace patterns (not shown) disposed in the substrate body.

Referring to FIGS. 2A and 2B, the package substrate 10 may include the hole pattern 110. The hole pattern 110 may include the first through hole 110a extending in a first direction parallel with the x-axis and the second through hole 110b extending in a second direction (i.e., parallel with the y-axis) perpendicular to the first direction. The first through hole 110a may be disposed to be parallel with the first central axis AX1 of the package substrate 10, and the second through hole 110b may be disposed to be parallel with the second central axis AX2 of the package substrate 10. The first central axis AX1 may be parallel with the first direction, and the second central axis AX2 may be parallel with the second direction. A cross point of the first and second central axes AX1 and AX2 may correspond to a central point AX0 of the package substrate 10. In an embodiment, the hole pattern 110 may have a cross shape provided by the first and second through holes 110a and 110b intersecting each other.

The package substrate 10 may be divided into two portions which are symmetric with respect to the first central axis AX1. In addition, the package substrate 10 may be divided into two portions which are symmetric with respect to the second central axis AX2. That is, when the package substrate 10 has a first length L10x in the x-axis direction and a second length L10y in the y-axis direction, the first central axis AX1 may pass a half point of the second length L10y and the second central axis AX2 may pass a half point of the first length L10x.

Referring to FIGS. 1, 2A, 2B, 3 and 4, the package substrate 10 may have the first surface 10S1 on which the first and second semiconductor chips 20a, 20b, 30a and 30b and a second surface 10S2 located opposite to the first and second semiconductor chips 20a, 20b, 30a and 30b. The package substrate 10 may have the first to fourth substrate regions A, B, C and D which are defined by the hole pattern 110. The first to fourth substrate regions A, B, C and D may be divided by the hole pattern 110.

Referring to FIGS. 1, 2A and 2B, the package substrate 10 may include first and second chip connection pads 201A, 201B, 201C, 201D, 301A, 301B, 301C and 301D which are disposed on the second surface 10S2 to be electrically connected to the first and second semiconductor chips 20a, 20b, 30a and 30b. For example, the package substrate 10 may include the first chip connection pads 201A disposed on the first substrate region A to be electrically connected to the first semiconductor chip 20a and the second chip connection pads 301A disposed on the first substrate region A to be electrically connected to the second semiconductor chip 30a, and the package substrate 10 may include the first chip connection pads 201B disposed on the second substrate region B to be electrically connected to the first semiconductor chip 20a and the second chip connection pads 301B disposed on the second substrate region B to be electrically connected to the second semiconductor chip 30b. In addition, the package substrate 10 may include the first chip connection pads 201C disposed on the third substrate region C to be electrically connected to the first semiconductor chip 20b and the second chip connection pads 301C disposed on the third substrate region C to be electrically connected to the second semiconductor chip 30a, and the package substrate 10 may include the first chip connection pads 201D disposed on the fourth substrate region D to be electrically connected to the first semiconductor chip 20b and the second chip connection pads 301D disposed on the fourth substrate region D to be electrically connected to the second semiconductor chip 30b.

Furthermore, the package substrate 10 may also include outer connection pads 102A, 102B, 102C and 102D disposed on the second surface 10S2 of the package substrate 10. The outer connection pads 102A, 102B, 102C and 102D may be disposed on the first to fourth substrate regions A, B, C and D, respectively. The outer connection pads 102A, 102B, 102C and 102D may be electrically connected to the first and second chip connection pads 201A, 201B, 201C, 201D, 301A, 301B, 301C and 301D corresponding to the conductive trace patterns disposed in the package substrate 10, respectively. For example, some of the outer connection pads 102A disposed on the first substrate region A may be electrically connected to some internal circuits of an upper chip (i.e., the first semiconductor chip 20a) of the first semiconductor chips 20a and 20b though the first chip connection pads 201A, and the remaining pads of the outer connection pads 102A disposed on the first substrate region A may be electrically connected to some internal circuits of a left chip (i.e., the second semiconductor chip 30a) of the second semiconductor chips 30a and 30b though the second chip connection pads 301A. In addition, some of the outer connection pads 102B disposed on the second substrate region B may be electrically connected to some internal circuits of the upper chip (i.e., the first semiconductor chip 20a) of the first semiconductor chips 20a and 20b though the first chip connection pads 201B, and the remaining pads of the outer connection pads 102B disposed on the second substrate region B may be electrically connected to some internal circuits of a right chip (i.e., the second semiconductor chip 30b) of the second semiconductor chips 30a and 30b though the second chip connection pads 301B. Moreover, some of the outer connection pads 102C disposed on the third substrate region C may be electrically connected to some internal circuits of a lower chip (i.e., the first semiconductor chip 20b) of the first semiconductor chips 20a and 20b though the first chip connection pads 201C, and the remaining pads of the outer connection pads 102C disposed on the third substrate region C may be electrically connected to some internal circuits of a left chip (i.e., the second semiconductor chip 30a) of the second semiconductor chips 30a and 30b though the second chip connection pads 301C. Furthermore, some of the outer connection pads 102D disposed on the fourth substrate region D may be electrically connected to some internal circuits of the lower chip (i.e., the first semiconductor chip 20b) of the first semiconductor chips 20a and 20b though the first chip connection pads 201D, and the remaining pads of the outer connection pads 102D disposed on the fourth substrate region D may be electrically connected to some internal circuits of a right chip (i.e., the second semiconductor chip 30b) of the second semiconductor chips 30a and 30b though the second chip connection pads 301D. Although not shown in the drawings, outer connection members may be attached to the outer connection pads 102A, 102B, 102C and 102D, respectively. The outer connection members may be disposed to electrically connect the semiconductor package 1 to another semiconductor package or an external semiconductor device. In some embodiments, signals controlling the first and second semiconductor chips 20a, 20b, 30a and 30b are communicated between the semiconductor package 1 and another semiconductor package or an external semiconductor device through the outer connection members. The outer connection members may be, for example, solder balls, bumps or solder paste patterns.

As described above, in an embodiment of the present disclosure, the outer connection pads 102A, 102B, 102C and 102D and the corresponding outer connection members may be disposed on respective ones of the first to fourth substrate regions A, B, C and D of the package substrate 10 to be adjacent to the first and second chip connection pads 201A, 201B, 201C, 201D, 301A, 301B, 301C and 301D. Thus, it may be possible to reduce lengths of internal interconnection lines (i.e., the conductive trace patterns) from the first and second chip connection pads 201A, 201B, 201C, 201D, 301A, 301B, 301C and 301D to the outer connection pads 102A, 102B, 102C and 102D.

Referring to FIGS. 1 and 3, the first semiconductor chips 20a and 20b may be disposed on the first surface 10S1 of the package substrate 10. The first semiconductor chips 20a and 20b may have a first length $L20x$ in a minor axis direction (i.e., the x-axis direction) and a second length $L20y$ in the major axis direction (i.e., the y-axis direction). The major axis of the first semiconductor chips 20a and 20b may be set to be parallel with the second central axis AX2.

The first semiconductor chips 20a and 20b may be disposed to overlap with the first through hole 110a. The first semiconductor chips 20a and 20b may be disposed to be symmetric with respect to the second central axis AX2. That is, the upper chip (i.e., the first semiconductor chip 20a) of the first semiconductor chips 20a and 20b may be disposed in an upper region of the second central axis AX2, and the lower chip (i.e., the first semiconductor chip 20b) of the first semiconductor chips 20a and 20b may be disposed in a lower region of the second central axis AX2. Each of the first semiconductor chips 20a and 20b may include two half portions which are symmetric with respect to the first central axis AX1. That is, the first central axis AX1 may pass a half point of the second length $L20y$ of the first semiconductor chips 20a and 20b.

The first semiconductor chip 20a may include first chip pads 210a which are electrically connected to the first chip connection pads 201A and 201B, and the first semiconductor chip 20b may include first chip pads 210b which are electrically connected to the first chip connection pads 201C and 201D. The first chip pads 210a may be disposed on a central portion of the first semiconductor chip 20a, and the first chip pads 210b may be disposed on a central portion of the first semiconductor chip 20b. The first chip pads 210a may be divided into two groups which are symmetric with respect to the first central axis AX1, and the first chip pads 210b may also be divided into two groups which are symmetric with respect to the first central axis AX1. That is, the first chip pads 210a of the upper chip 20a may be divided into two groups which are symmetric with respect to the first central axis AX1, and the first chip pads 210b of the lower chip 20b may also be divided into two groups which are symmetric with respect to the first central axis AX1.

The first chip pads 210a may be disposed on a surface of the first semiconductor chip 20a, which faces the first surface 10S1 of the package substrate 10, and the first chip pads 210b may be disposed on a surface of the first semiconductor chip 20b, which faces the first surface 10S1 of the package substrate 10. The first chip pads 210a of the upper chip 20a may be connected to the first chip connection pads 201A disposed on the first substrate region A and the first chip connection pads 201B disposed on the second substrate region B through first bonding wires 220a. For example, the first bonding wires 220a may pass through the first through hole 110a to electrically connect the first chip pads 210a to the first chip connection pads 201A and 201B. Similarly, the first chip pads 210b of the lower chip 20b may be connected to the first chip connection pads 201C disposed on the third substrate region C and the first chip connection pads 201D disposed on the fourth substrate region D through first bonding wires 220b.

Referring to FIGS. 1 and 4, the second semiconductor chips 30a and 30b may be disposed above the first surface 10S1 of the package substrate 10. As described with reference to FIG. 1, the second semiconductor chips 30a and 30b may be stacked on the first semiconductor chips 20a and 20*b*. That is, after the first semiconductor chips 20*a* and 20*b* are disposed on the first surface 10S1 of the package substrate 10, the second semiconductor chips 30*a* and 30*b* may be disposed on the first semiconductor chips 20*a* and 20*b* without contacting the package substrate 10. To avoid complexity of the drawing, the illustration of the first semiconductor chips 20*a* and 20*b* is omitted in FIG. 4.

The second semiconductor chips 30*a* and 30*b* may have a first length L30*x* in a major axis direction (i.e., the x-axis direction) and a second length L30*y* in a minor axis direction (i.e., the y-axis direction). The major axis of the second semiconductor chips 30*a* and 30*b* may be parallel with the first central axis AX1.

The second semiconductor chips 30*a* and 30*b* may be disposed to overlap with the second through hole 110*b*. Referring to FIGS. 1 and 3, because the second through hole 110*b* is not covered with first semiconductor chips 20*a* and 20*b*, the second semiconductor chips 30*a* and 30*b* may directly face the second through hole 110*b*. The second semiconductor chips 30*a* and 30*b* may be disposed to be symmetric with respect to the first central axis AX1. That is, the left chip 30*a* of the second semiconductor chips 30*a* and 30*b* may be located at a left side of the first central axis AX1, and the right chip 30*b* of the second semiconductor chips 30*a* and 30*b* may be located at a right side of the first central axis AX1.

The second semiconductor chips 30*a* and 30*b* may be disposed to be symmetric with respect to the second central axis AX2. That is, the second central axis AX2 may pass a half point of the first length L20*x* of the second semiconductor chips 30*a* and 30*b*.

The second semiconductor chip 30*a* may include second chip pads 310*a* which are electrically connected to the second chip connection pads 301A and 301C, and the second semiconductor chip 30*b* may include second chip pads 310*b* which are electrically connected to the second chip connection pads 301B and 301D. The second chip pads 310*a* may be disposed on a central portion of the second semiconductor chip 30*a*, and the second chip pads 310*b* may be disposed on a central portion of the second semiconductor chip 30*b*. The second chip pads 310*a* may be divided into two groups which are symmetric with respect to the second central axis AX2, and the second chip pads 310*b* may also be divided into two groups which are symmetric with respect to the second central axis AX2. That is, the second chip pads 310*a* of the left chip 30*a* may be divided into two groups which are symmetric with respect to the second central axis AX2, and the second chip pads 310*b* of the right chip 30*b* may also be divided into two groups which are symmetric respect to the second central axis AX2.

The second chip pads 310*a* may be disposed on a surface of the second semiconductor chip 30*a*, which faces the first surface 10S1 of the package substrate 10, and the second chip pads 310*b* may be disposed on a surface of the second semiconductor chip 30*b*, which faces the first surface 10S1 of the package substrate 10. The second chip pads 310*a* of the left chip 30*a* may be connected to the second chip connection pads 301A disposed on the first substrate region A and the second chip connection pads 301C disposed on the third substrate region C through second bonding wires 320*a*. For example, the second bonding wires 320*a* may pass through the second through hole 110*b* to electrically connect the second chip pads 310*a* to the second chip connection pads 301A and 301B. Similarly, the second chip pads 310*b* of the right chip 30*b* may be connected to the second chip connection pads 301B disposed on the second substrate region B and the second chip connection pads 301D disposed on the fourth substrate region D through second bonding wires 320*b*.

As described above, the package substrate 10 include the first and second through holes 110*a* and 110*b* intersecting each other in a plan view. Thus, the first semiconductor chips 20*a* and 20*b* mounted on the package substrate 10 may be wire-bonded to the package substrate 10 using the first through hole 110*a*, and second semiconductor chips 30*a* and 30*b* stacked on the first semiconductor chips 20*a* and 20*b* may be wire-bonded to the package substrate 10 using the second through hole 110*b*. As a result, the first and second semiconductor chips 20*a*, 20*b*, 30*a* and 30*b* may be efficiently stacked on the package substrate 10. In such a case, the second semiconductor chips 30*a* and 30*b* may overlap with the first semiconductor chips 20*a* and 20*b* on the first to fourth substrate regions A, B, C and D of the package substrate 10. Hence, the integration density of the semiconductor package 1 may increase, and a size of the semiconductor package 1 may be reduced.

Figure 5:
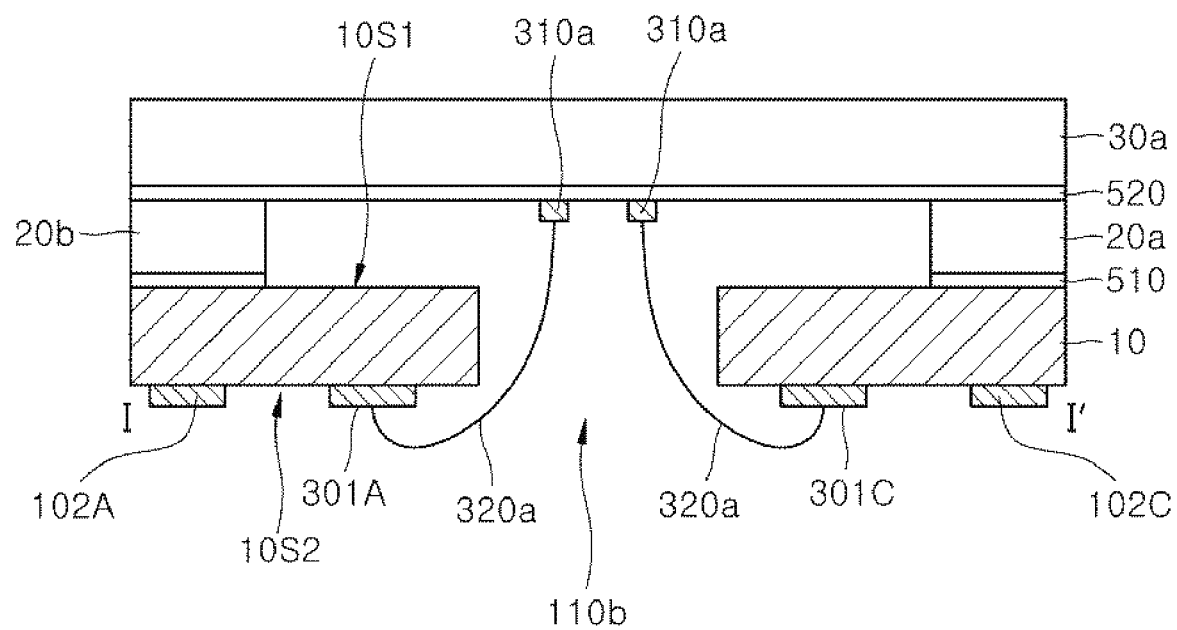
FIG. 5 is a cross-sectional view taken along a line I-I' of FIG. 1.
Figure 6:
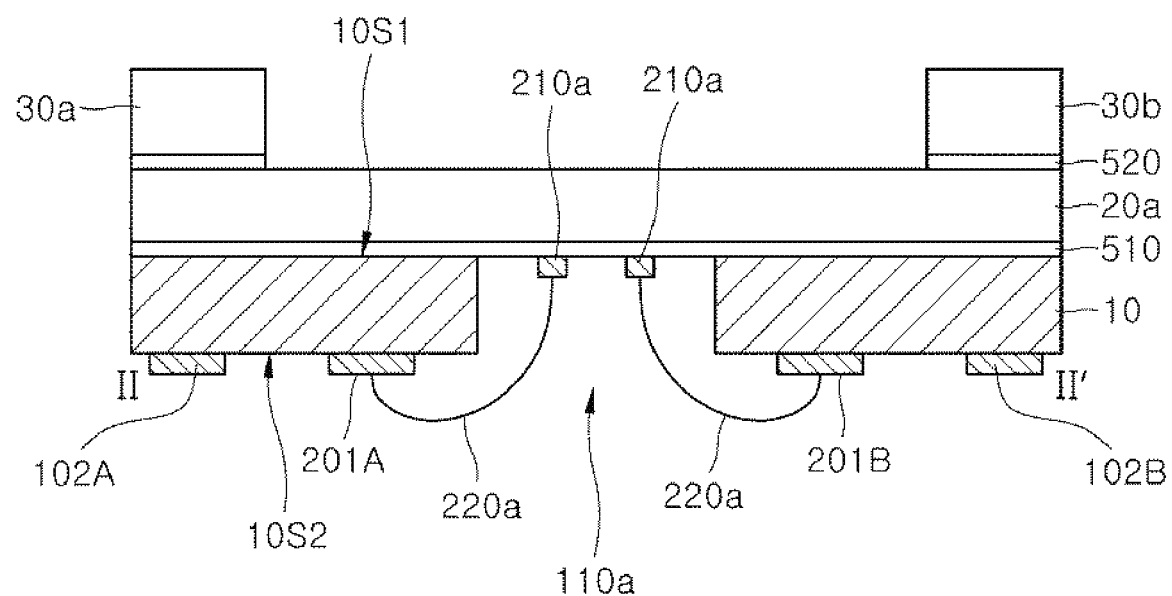
FIG. 6 is a cross-sectional view taken along a line II-II' of FIG. 1.

FIG. 5 is a cross-sectional view taken along a line I-I' of FIG. 1. FIG. 6 is a cross-sectional view taken along a line II-II' of FIG. 1. Referring to FIGS. 5 and 6, the first semiconductor chips 20*a* and 20*b* may be stacked on the first surface 10S1 of the package substrate 10, and the second semiconductor chips 30*a* and 30*b* may be stacked on the first semiconductor chips 20*a* and 20*b*. The first chip pads 210*a* may be disposed on a central region of the first semiconductor chip 20*a* and may be disposed to directly face the first through hole 110*a*. The second chip pads 310*a* may be disposed on a central region of the second semiconductor chip 30*a* and may be disposed to directly face the second through hole 110*b*.

The first chip connection pads 201A and 201B may be disposed on the second surface 10S2 of the package substrate 10. The outer connection pads 102A and 102B may be disposed on the second surface 10S2 of the package substrate 10 to be adjacent to the first chip connection pads 201A and 201B. Although not shown in the drawings, the outer connection pads 102A and 102B may be electrically connected to the first chip connection pads 201A and 201B or the second chip connection pads 301A and 301B through conductive trace patterns. The outer connection members (not shown) may be attached to the outer connection pads 102A and 102B.

Referring again to FIG. 6, the first chip pads 210*a* of the first semiconductor chip 20*a* may be electrically connected to the first chip connection pads 201A and 201B disposed on the second surface 10S2 of the package substrate 10 by the first bonding wires 220*a* passing through the first through hole 110*a*. In some embodiments, through the first bonding wires 220*a*, signals controlling the first semiconductor chip 20*a* are communicated between the package substrate 10 and the first semiconductor chip 20*a*. The first semiconductor chip 20*a* may be a face-down type chip (also, referred to as a flip chip) having an active layer and chip pads (corresponding to the first chip pads 210*a*) that face the first through hole 110*a*. As illustrated in FIG. 6, the first semiconductor chip 20*a* may be bonded to the package substrate 10 by a first adhesive layer 510.

Referring to FIGS. 1 and 5, the first semiconductor chips 20*a* and 20*b* may be disposed on the first surface 10S1 of the package substrate 10 including the second through hole 110*b*. The second semiconductor chip 30*a* may be stacked on the first semiconductor chips 20*a* and 20*b*. The first semiconductor chips 20*a* and 20*b* may be bonded to the package substrate 10 by the first adhesive layer 510, and the second semiconductor chip 30a may be bonded to the first semiconductor chips 20a and 20b by a second adhesive layer 520. The second chip pads 310a may be disposed on a central region of the second semiconductor chip 30a. As illustrated in the drawings, because the second through hole 110b is not covered with the first semiconductor chips 20a and 20b, the second chip pads 310a may directly face the second through hole 110b.

The second chip connection pads 301A and 301C may be disposed on the second surface 10S2 of the package substrate 10. The outer connection pads 102A and 102C may be disposed on the second surface 10S2 of the package substrate 10 to be adjacent to the second chip connection pads 301A and 301C. Although not shown in the drawings, the outer connection pads 102A and 102C may be electrically connected to the first chip connection pads 201A and 201C or the second chip connection pads 301A and 301C through conductive trace patterns. The outer connection members (not shown) may be attached to the outer connection pads 102A and 102C.

Referring again to FIG. 5, the second chip pads 310a of the second semiconductor chip 30a may be connected to the second chip connection pads 301A and 301C disposed on the second surface 10S2 of the package substrate 10 by the second bonding wires 320a passing through the second through hole 110b. In some embodiments, through the second bonding wires 320a, signals controlling the second semiconductor chip 30a are communicated between the package substrate 10 and the second semiconductor chip 30a. The second semiconductor chip 30a may be a face-down type chip (also, referred to as a flip chip) having an active layer and chip pads (corresponding to the second chip pads 310a) that face the second through hole 110b.

Figure 7:
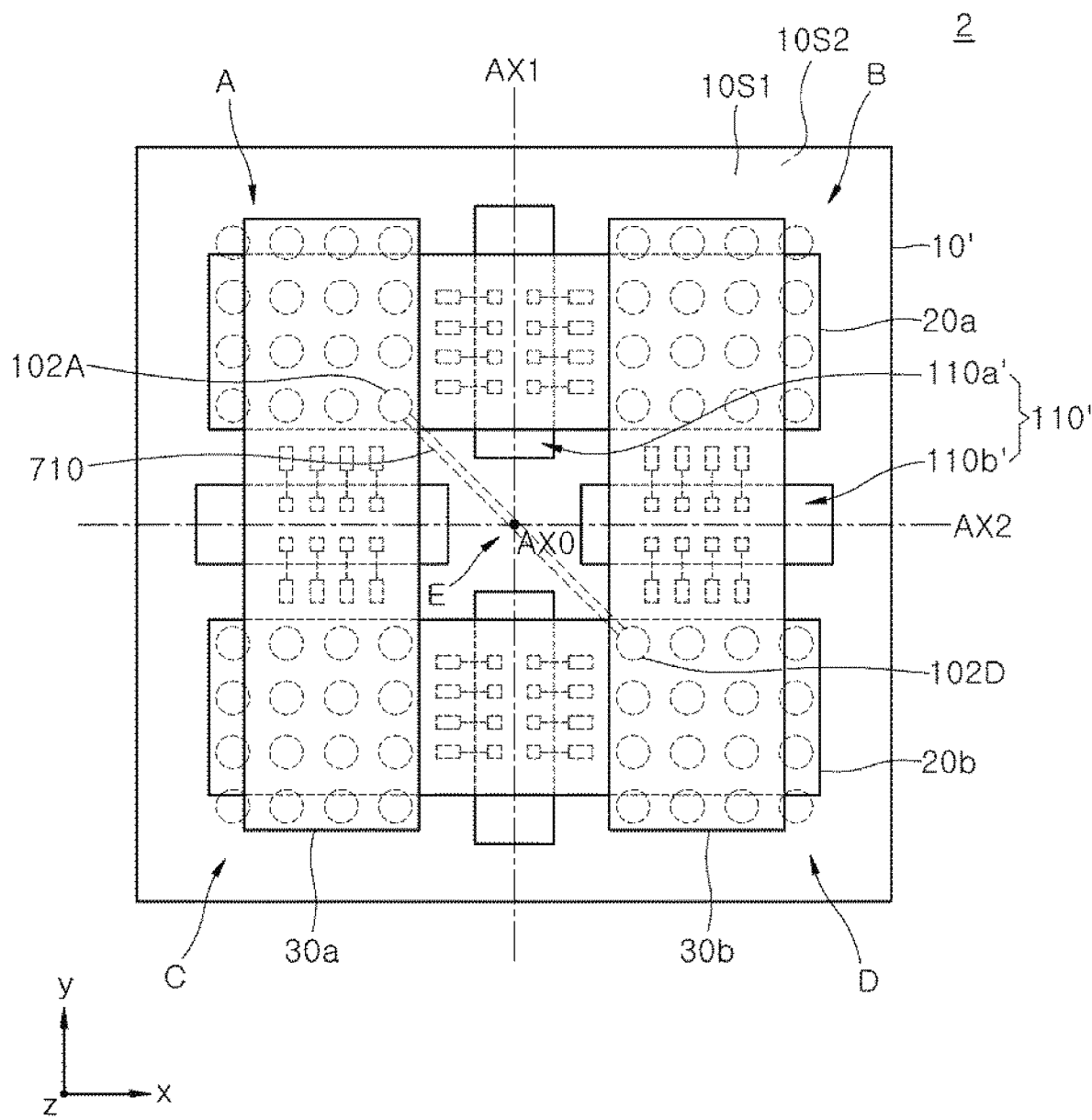
FIG. 7 is a plan view illustrating a semiconductor package according to another embodiment of the present disclosure.

FIG. 7 is a plan view illustrating a semiconductor package 2 according to another embodiment of the present disclosure. Referring to FIG. 7, the semiconductor package 2 may include a package substrate 10' having a hole pattern 110', the first semiconductor chips 20a and 20b stacked on the package substrate 10', and the second semiconductor chips 30a and 30b stacked on the first semiconductor chips 20a and 20b. In the present embodiment, the semiconductor package 2 may have substantially the same configuration as the semiconductor package 1 illustrated in FIGS. 1 2A, 2B, and 3 to 6 except the hole pattern 110' of the package substrate 10'. The package substrate 10' may have the first surface 10S1 and the second surface 10S2, and the first and second semiconductor chips 20a, 20b, 30a and 30b may be stacked on the first surface 10S1.

Referring to FIG. 7, the hole pattern 110' may include a plurality of first through holes 110a' and a plurality of second through holes 110b'. For example, the number of the plurality of first through holes 110a' may be two, and the two first through holes 110a' may be arrayed to be spaced apart from each other in a first direction parallel with the first central axis AX1. Similarly, the number of the plurality of second through holes 110b' may be two, and the two second through holes 110b' may be arrayed to be spaced apart from each other in a second direction parallel with the second central axis AX2. Thus, as compared with the hole pattern 110 of the package substrate 10 illustrated in FIGS. 2A and 2B, the hole pattern 110' of FIG. 7 may have a shape that the two first through holes 110a' do not intersect the two second through holes 110b' in a plan view. That is, in the package substrate 10' of FIG. 7, none of the first through holes 110a' and the second through holes 110b' may be formed in a fifth substrate region E (i.e., a central region) including the central point AX0 of the package substrate 10'. At least one conductive trace pattern 710 may be disposed in the fifth substrate region E of the package substrate 10'. That is, the conductive trace pattern 710 may be disposed in a common region of a first region between the first through holes 110a' and a second region between the second through holes 110b'.

In an embodiment, the conductive trace pattern 710 may extend to directly connect at least one of the outer connection pads 102A in the first substrate region A to at least one of the outer connection pads 102D in the fourth substrate region D. This may lead to reducing a length of a routing path that transmits electric signals between at least one of the outer connection pads 102A and at least one of the outer connection pads 102D. As such, the first through holes 110a' may be disposed not to intersect the second through holes 110b', thereby additionally providing the conductive trace pattern 710 in the package substrate 10'. In some embodiments, the conductive trace pattern 710 may effectively transmit the electric signals controlling the first semiconductor chips 20a and 20b in the package substrate 10'.

Figure 8:
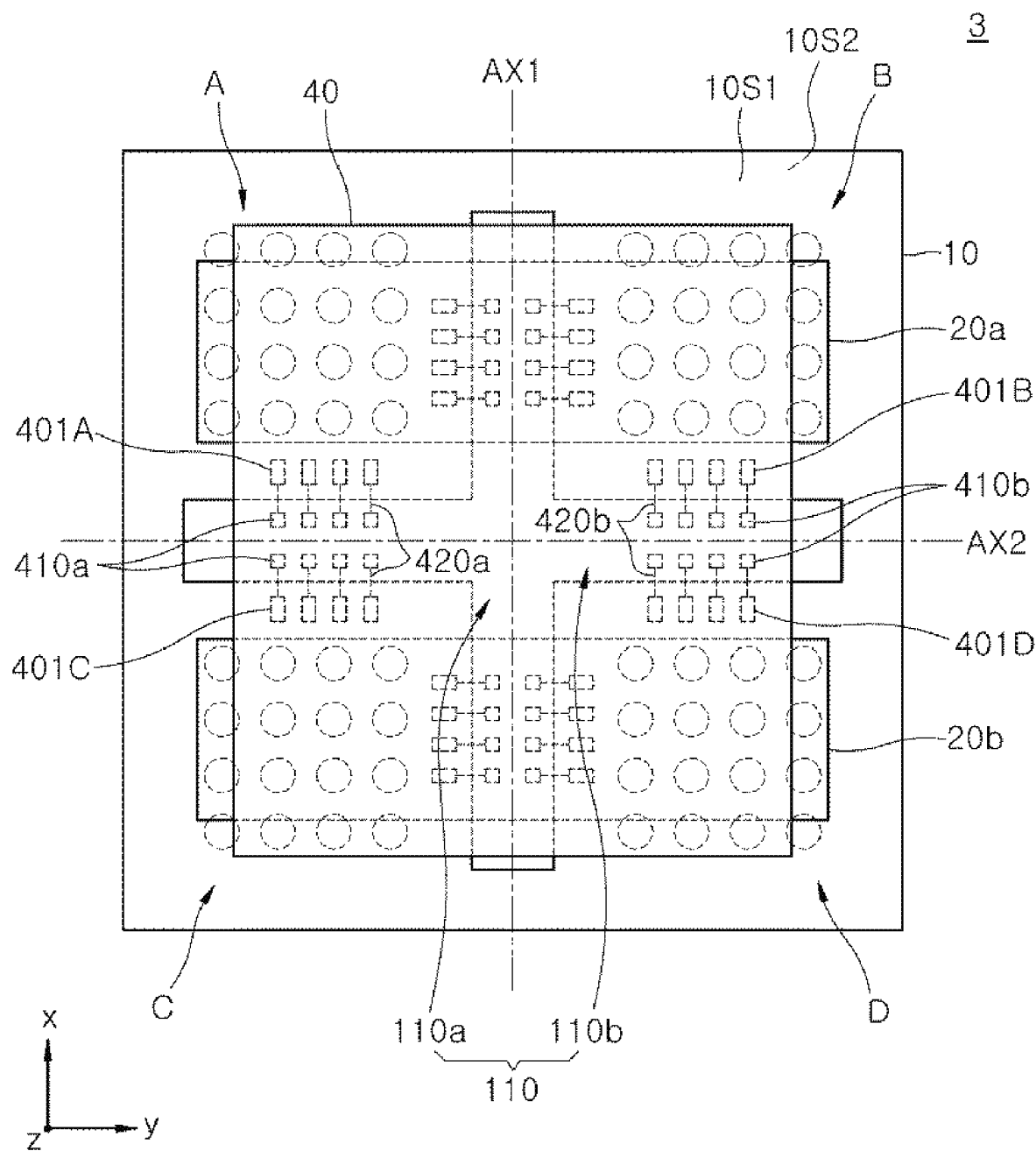
FIG. 8 is a plan view illustrating a semiconductor package according to yet another embodiment of the present disclosure.

FIG. 8 is a plan view illustrating a semiconductor package 3 according to yet another embodiment of the present disclosure. Referring to FIG. 8, the semiconductor package 3 may include the package substrate 10 having the hole pattern 110, the first semiconductor chips 20a and 20b stacked on the package substrate 10, and the second semiconductor chip 40 stacked on the first semiconductor chips 20a and 20b. In the present embodiment, the semiconductor package 3 may have substantially the same configuration as the semiconductor package 1 illustrated in FIGS. 1, 2A, 2B, and 3 to 6 except that the second semiconductor chip 40 has a size which is different from a size of each of the first semiconductor chips 20a and 20b.

As illustrated in FIG. 8, the first semiconductor chips 20a and 20b may be disposed on the first surface 10S1 of the package substrate 10 to be symmetric with respect to the second central axis AX2. The second semiconductor chip 40 may be a single chip stacked on the first semiconductor chips 20a and 20b. The second semiconductor chip 40 may be disposed to overlap with the second through hole 110b exposed between the first semiconductor chips 20a and 20b in a plan view. In such a case, the second semiconductor chip 40 may include second chip pads 410a and 410b. The second chip pads 410a and 410b may be electrically connected to second chip connection pads 401A, 401B, 401C and 401D disposed in respective ones of the first to fourth substrate regions A, B, C and D through second bonding wires 420a and 420b.

In some other embodiments not illustrated in the drawings, the second semiconductor chip 40 may include only one group of the second chip pads 410a and 410b. In such a case, the one group of the second chip pads 410a and 410b may be electrically connected to the corresponding pads of the second chip connection pads 401A, 401B, 401C and 401D of the package substrate 10.

Figure 9:
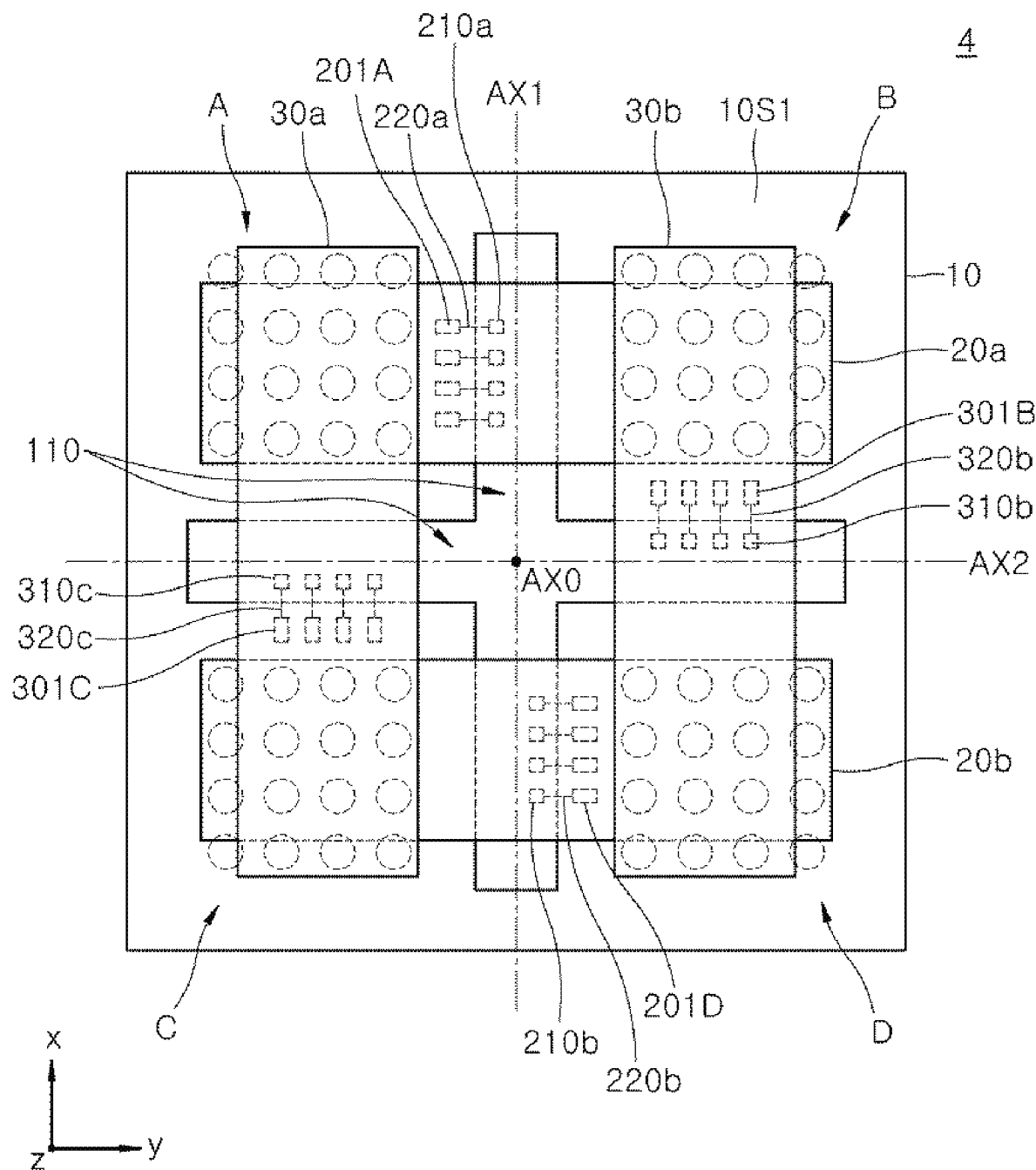
FIG. 9 is a plan view illustrating a semiconductor package according to still another embodiment of the present disclosure.

FIG. 9 is a plan view illustrating a semiconductor package 4 according to still another embodiment of the present disclosure. Referring to FIG. 9, the semiconductor package 4 may include the package substrate 10 having the hole pattern 110, the first semiconductor chips 20a and 20b stacked on the package substrate 10, and the second semiconductor chips 30a and 30b stacked on the first semiconductor chips 20a and 20b. In the present embodiment, the semiconductor package 4 may have substantially the same configuration as the semiconductor package 1 illustrated in FIGS. 1, 2A, 2B, and 3 to 6 except that the package substrate 10 has only the first and second chip connection pads 201A, 201D, 301B and 301C as chip connection pads and the semiconductor chips 20a, 20b, 30a and 30b have only the first and second chip pads 210a, 210b, 310a and 310b as chip pads.

The first chip connection pads 201A of the package substrate 10 may be disposed at only one side of the first central axis AX1, and the first chip connection pads 201D of the package substrate 10 may also be disposed at only one side of the first central axis AX1. In addition, the second chip connection pads 301B of the package substrate 10 may be disposed at only one side of the second central axis AX2, and the second chip connection pads 301C of the package substrate 10 may also be disposed at only one side of the second central axis AX2. Thus, the first chip pads 210a may be disposed to be adjacent to the first chip connection pads 201A, and the first chip pads 210b may be disposed to be adjacent to the first chip connection pads 201D. Similarly, the second chip pads 310b may be disposed to be adjacent to the second chip connection pads 301B, and the second chip pads 310c may be disposed to be adjacent to the second chip connection pads 301C. The first chip pads 210a may be electrically connected to the first chip connection pads 201A through the first bonding wires 220a, and the first chip pads 210b may be electrically connected to the first chip connection pads 201D through the first bonding wires 220b. Moreover, the second chip pads 310b may be electrically connected to the second chip connection pads 301B through the second bonding wires 320b, and the second chip pads 310c may be electrically connected to the second chip connection pads 301C through second bonding wires 320c.

As compared with the semiconductor package 1 illustrated in FIGS. 1 and 6, all of internal circuits in the upper chip 20a of the first semiconductor chips 20a and 20b may communicate with the package substrate 10 through the first chip connection pads 201A and all of internal circuits in the lower chip 20b of the first semiconductor chips 20a and 20b may communicate with the package substrate 10 through the first chip connection pads 201D. Similarly, all of internal circuits in the right chip 30b of the second semiconductor chips 30a and 30b may communicate with the package substrate 10 through the second chip connection pads 301B, and all of internal circuits in the left chip 30a of the second semiconductor chips 30a and 30b may communicate with the package substrate 10 through the second chip connection pads 301C.

In the semiconductor package 4 according to the present embodiment, the first and second chip connection pads 201A, 201D, 301B and 301C may be disposed at any one side of the first or second central axis AX1 or AX2 as compared with the semiconductor package 1 illustrated in FIGS. 1, 2A, 2B. 3 to 6. Thus, the number of the first and second chip connection pads 201A, 201D, 301B and 301C illustrated in FIG. 9 may be reduced to a half of the number of the first and second chip connection pads 201A, 201B, 201C, 201D, 301A, 301B, 301C and 301D illustrated in FIGS. 2A and 2B. However, the present disclosure is not limited thereto. In some other embodiments, the number of the first chip connection pads 201A disposed on the first substrate region A may increase as compared with the present embodiment, and the number of the first chip connection pads 201D disposed on the fourth substrate region D may also increase as compared with the present embodiment. Similarly, the number of the second chip connection pads 301B disposed on the second substrate region B may increase as compared with the present embodiment, and the number of the second chip connection pads 301C disposed on the third substrate region C may also increase as compared with the present embodiment. For example, in some other embodiments, the number of the first and second chip connection pads 201A, 201D, 301B and 301C may be twice the number of the first and second chip connection pads 201A, 201D, 301B and 301C included in the semiconductor package 4 according to the present embodiment.

Figure 10A:
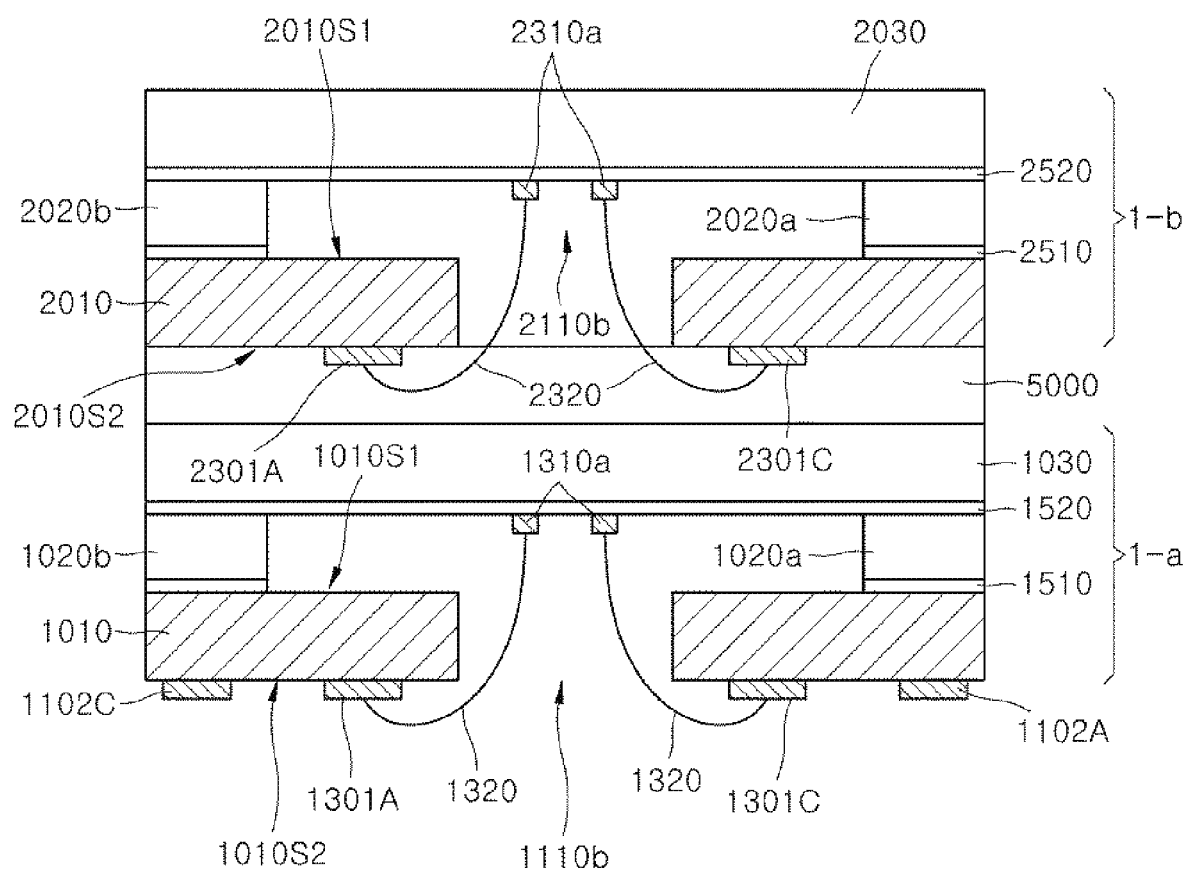
FIGS. 10A and 10B are cross-sectional views illustrating a semiconductor package module according to an embodiment of the present disclosure.
Figure 10B:
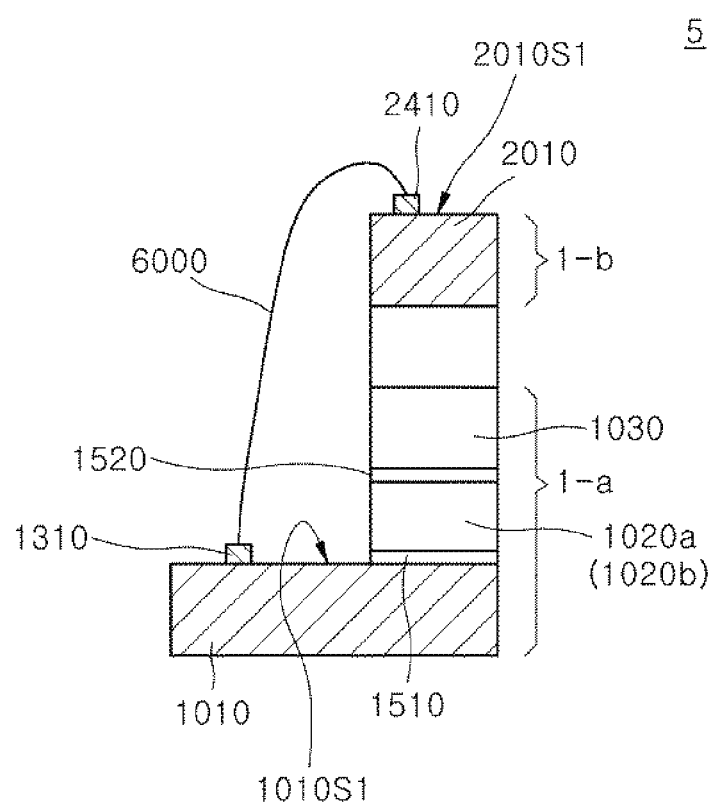

FIGS. 10A and 10B are cross-sectional views illustrating a semiconductor package module 5 according to an embodiment of the present disclosure. Referring to FIGS. 10A and 10B, the semiconductor package module 5 may include a first semiconductor package 1-a and a second semiconductor package 1-b which are vertically stacked. The first semiconductor package 1-a may have the same configuration as any one of the semiconductor packages 1, 2, 3 and 4. The second semiconductor package 1-b may have the same configuration as any one of the semiconductor packages 1, 2, 3 and 4. The first and second semiconductor packages 1-a and 1-b may have the same configuration or may have different configurations.

Referring to FIG. 10a, the first semiconductor package 1-a may include a package substrate 1010, first semiconductor chips 1020a and 1020b, and a second semiconductor chip 1030. The package substrate 1010 may have a first surface 101051 and a second surface 101052. The first semiconductor chips 1020a and 1020b may be bonded to the package substrate 1010 using an adhesive layer 1510, and the second semiconductor chip 1030 may be bonded to the first semiconductor chips 1020a and 1020b using an adhesive layer 1520.

Chip connection pads 1301A and 1301C and outer connection pads 1102A and 1102C may be disposed on the second surface 101052 of the package substrate 1010. Outer connection members may be attached to the outer connection pads 1102A and 1102C, respectively.

The second semiconductor chip 1030 may include chip pads 1310a which are disposed to face a through hole 1110b penetrating the package substrate 1010. The chip pads 1310a may be electrically connected to the chip connection pads 1301A and 1301C by bonding wires 1320 passing through the through hole 1110b.

Referring again to FIG. 10A, the second semiconductor package 1-b may be stacked on the first semiconductor package 1-a. The second semiconductor package 1-b may be bonded to the first semiconductor package 1-a using an adhesive layer 5000.

The second semiconductor package 1-b may include a package substrate 2010, first semiconductor chips 2020a and 2020b, and a second semiconductor chip 2030. The package substrate 2010 may have a first surface 2010S1 and a second surface 2010S2. The first semiconductor chips 2020a and 2020b may bonded to the package substrate 2010 using an adhesive layer 2510, and the second semiconductor chip 2030 may be bonded to the first semiconductor chips 2020a and 2020b using an adhesive layer 2520. Chip connection pads 2301A and 2301C may be disposed on the second surface 2010S2 of the package substrate 2010.

The second semiconductor chip 2030 may include chip pads 2310a. The chip pads 2310a may be electrically connected to the chip connection pads 2301A and 2301C by bonding wires 2320 passing through a through hole 2110b.

Referring to FIG. 10B, the first semiconductor package 1-a and the second semiconductor package 1-b may be bonded to each other by a wire bonding technique applied to the package substrates 1010 and 2010. Connection pads 1310 for a wire bonding process may be disposed on a surface of the package substrate 1010 of the first semiconductor package 1-a, and connection pads 2410 for a wire bonding process may be disposed on a surface of the package substrate 2010 of the second semiconductor package 1-*b*. For example, the connection pads 1310 and 2410 may be disposed on the first surfaces 1010S1 and 2010S1 of the package substrates 1010 and 2010 illustrated in FIG. 10A, respectively. The first and second semiconductor packages 1-*a* and 1-*b* may communicate with each other using bonding wires 6000 that electrically connect the connection pads 1310 to the connection pads 2410.

As described above, the semiconductor package 5 may be realized by disposing the first and second semiconductor chips 1020*a*, 1020*b* and 1030 of the first semiconductor package 1-*a* (corresponding to a lower package) to face the package substrate 2010 of the second semiconductor package 1-*b* (corresponding to an upper package).

Figure 11A:
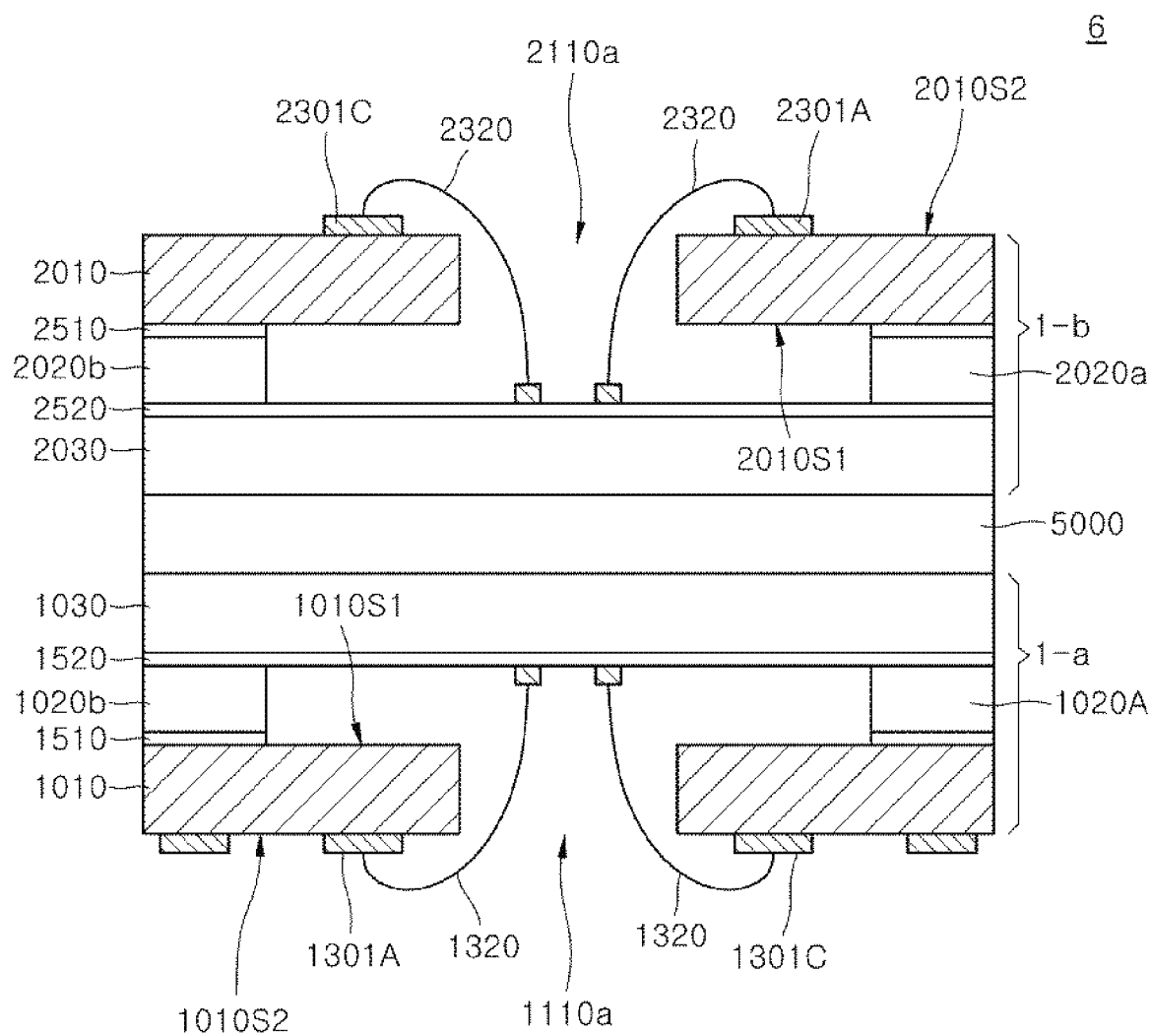
FIGS. 11A and 11B are cross-sectional views illustrating a semiconductor package module according to another embodiment of the present disclosure.
Figure 11B:
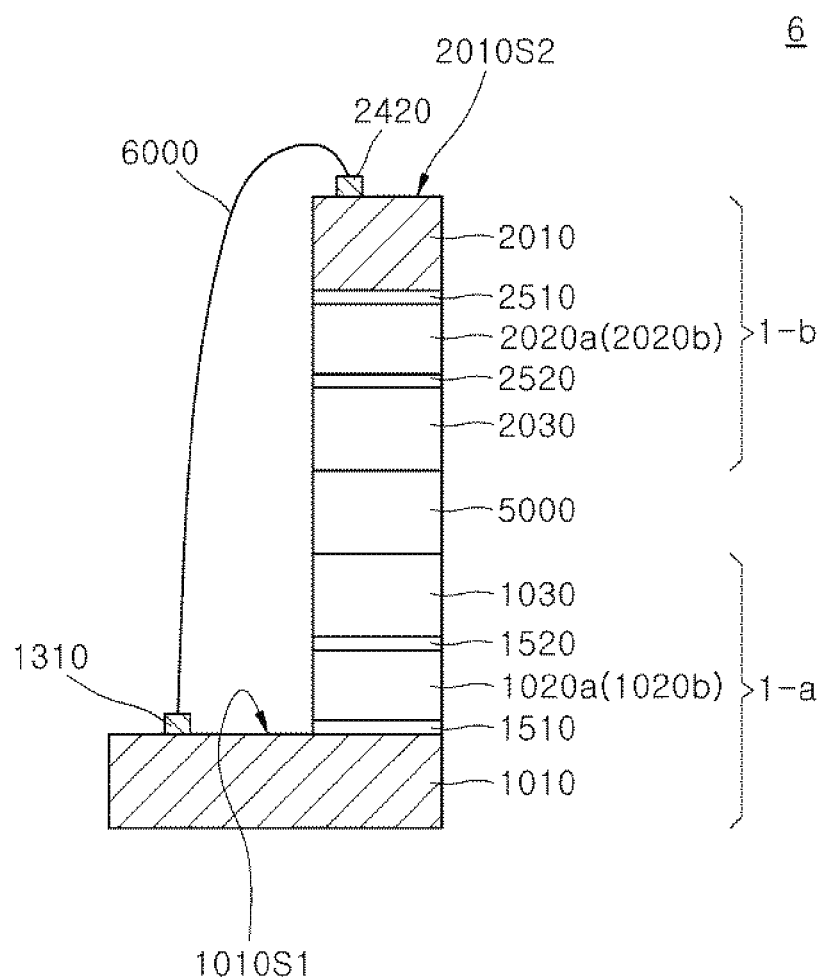

FIGS. 11A and 11B are cross-sectional views illustrating a semiconductor package module 6 according to another embodiment of the present disclosure. Referring to FIGS. 11A and 11B, the semiconductor package module 6 may be distinguished from the semiconductor package module 5 illustrated in FIGS. 10A and 10B by a technique for bonding the first semiconductor package 1-*a* to the second semiconductor package 1-*b*. The first semiconductor package 1-*a* included in the semiconductor package module 6 may have substantially the same configuration as the first semiconductor package 1-*a* included in the semiconductor package module 5, and the second semiconductor package 1-*b* included in the semiconductor package module 6 may have substantially the same configuration as the second semiconductor package 1-*b* included in the semiconductor package module 5.

Referring to FIG. 11A, the first and second semiconductor chips 1020*a*, 1020*b* and 1030 of the first semiconductor package 1-*a* (corresponding to a lower package) may be disposed to face the first and second semiconductor chips 2020*a*, 2020*b* and 2030 of the second semiconductor package 1-*b* (corresponding to an upper package).

Referring to FIG. 11B, the first semiconductor package 1-*a* and the second semiconductor package 1-*b* may be bonded to each other by a wire bonding technique applied to the package substrates 1010 and 2010. The connection pads 1310 for a wire bonding process may be disposed on a surface of the package substrate 1010 of the first semiconductor package 1-*a*, and connection pads 2420 for a wire bonding process may be disposed on a surface of the package substrate 2010 of the second semiconductor package 1-*b*. For example, the connection pads 1310 may be disposed on the first surfaces 1010S1 of the package substrates 1010 illustrated in FIG. 11A, and the connection pads 2420 may be disposed on the second surface 2010S2 of the package substrates 2010. The first and second semiconductor packages 1-*a* and 1-*b* may communicate with each other using bonding wires 6000 that electrically connect the connection pads 1310 to the connection pads 2420.

As described above, a semiconductor package according to an embodiment may be realized by effectively stacking a plurality of semiconductor chips on a package substrate using a wire bonding connection technique. In such a case, the package substrate may include a plurality of through holes extending in different directions. After the plurality of semiconductor chips are stacked to overlap with the through holes, the plurality of semiconductor chips may be electrically connected to the package substrate by a wire bonding process using the through holes. As a result, the integration density of the semiconductor package may increase, and a size of the semiconductor package may be reduced.

Figure 12:
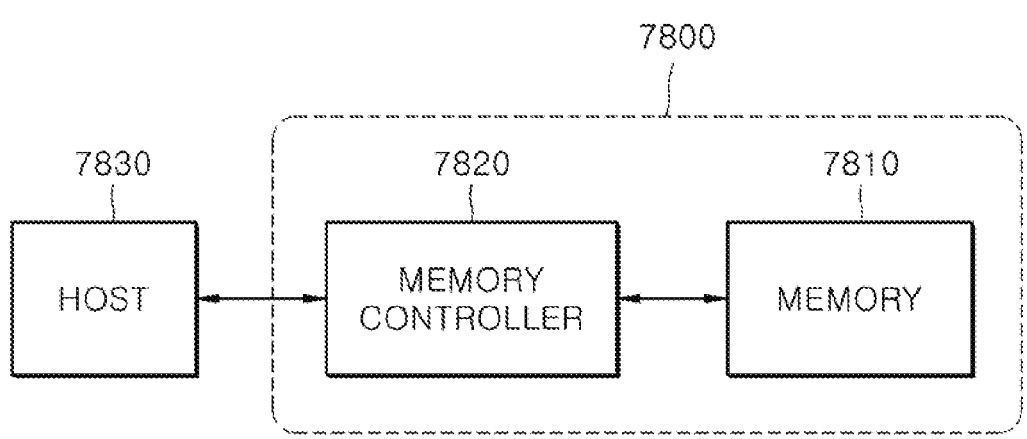
FIG. 12 is a block diagram illustrating an electronic system employing a memory card including at least one of the semiconductor packages according to the embodiments.

FIG. 12 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 13:
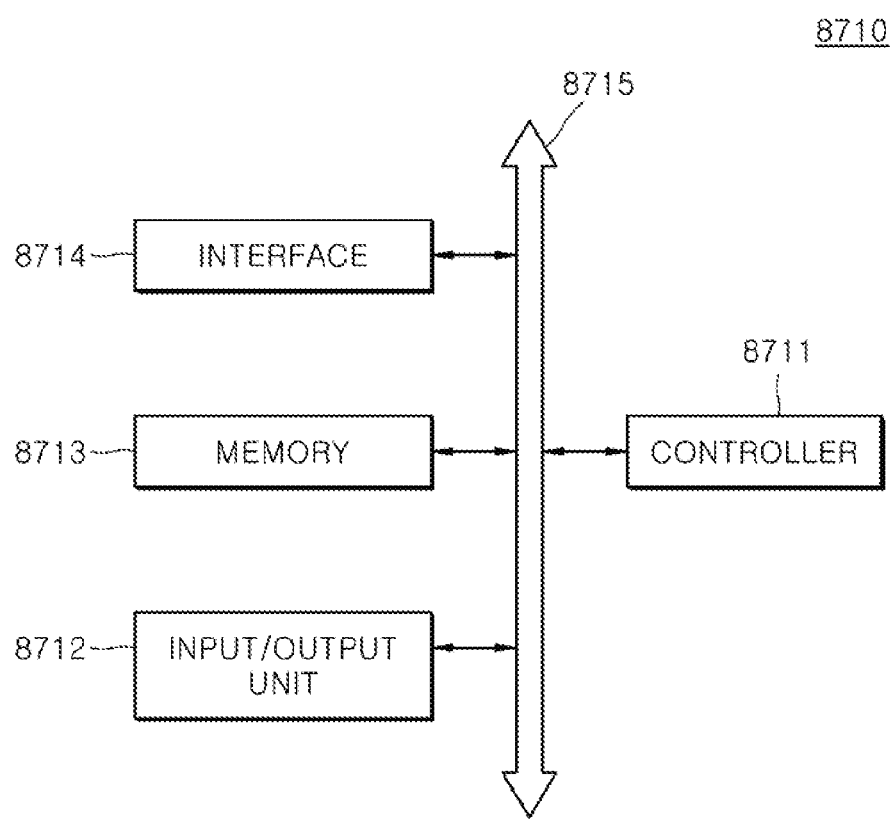
FIG. 13 is a block diagram illustrating another electronic system including at least one of the semiconductor packages according to the embodiments.

FIG. 13 is a block diagram illustrating an electronic system 8710 including at least one of the semiconductor packages according to the embodiments. The electronic system 8710 may include a controller 8711, an input/output unit 8712 and a memory 8713. The controller 8711, the input/output unit 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a package substrate having a hole pattern including a first through hole extending in a first direction and a second through hole extending in a second direction substantially perpendicular to the first direction;
at least one first semiconductor chip disposed on a surface of the package substrate to overlap with the first through hole;
at least one second semiconductor chip disposed on the surface of the package substrate to overlap with the second through hole;
first bonding wires passing through the first through hole to electrically connect the at least one first semiconductor chip to the package substrate; and
second bonding wires passing through the second through hole to electrically connect the at least one second semiconductor chip to the package substrate,
wherein the at least one second semiconductor chip is stacked on the at least one first semiconductor chip on the surface of the package substrate,
wherein the hole pattern has a cross shape provided by the first and second through holes intersecting each other.

2. The semiconductor package of claim 1, further comprising:
first chip pads disposed on the at least one first semiconductor chip to overlap with the first through hole; and
second chip pads disposed on the at least one second semiconductor chip to overlap with the second through hole,
wherein the first bonding wires are bonded to the first chip pads, and
wherein the second bonding wires are bonded to the second chip pads.

3. The semiconductor package of claim 2,
wherein the first chip pads are disposed on a central region of the first semiconductor chip; and
wherein the second chip pads are disposed on a central region of the second semiconductor chip.

4. The semiconductor package of claim 1,
wherein the at least one first semiconductor chip is disposed on the package substrate; and
wherein the at least one second semiconductor chip is disposed on the at least one first semiconductor chip.

5. The semiconductor package of claim 1,
wherein the at least one first semiconductor chip includes two first semiconductor chips disposed on a surface of the package substrate to be substantially parallel with each other; and
wherein the at least one second semiconductor chip includes two second semiconductor chips disposed on the two first semiconductor chips to be parallel with each other.

6. The semiconductor package of claim 5,
wherein the two first semiconductor chips are disposed to intersect the two second semiconductor chips at substantially a right angle; and
wherein the two first semiconductor chips overlap with the two second semiconductor chips at four overlapping regions on a surface of the package substrate.

7. The semiconductor package of claim 1, wherein the at least one first semiconductor chip and the least one second semiconductor chip have the same size.

8. The semiconductor package of claim 1,
wherein the at least one first semiconductor chip includes two first semiconductor chips disposed on a surface of the package substrate to be parallel with each other;
wherein the at least one second semiconductor chip includes a single second semiconductor chip disposed on the two first semiconductor chips; and
wherein the single second semiconductor chip is disposed to overlap with the second through hole exposed between the two first semiconductor chips.

9. The semiconductor package of claim 1, wherein the package substrate includes:
first chip connection pads to which the first bonding wires are bonded; and
second chip connection pads to which the second bonding wires are bonded.

10. The semiconductor package of claim 9,
wherein the package substrate further includes outer connection pads that are disposed on a surface of the package substrate and electrically connected to the first and second chip connection pads; and
wherein the outer connection pads and the first and second chip connection pads are disposed on a same surface.

11. A semiconductor package comprising:
a package substrate configured to have a hole pattern including a first through hole and a second through hole intersecting each other and configured to have first to fourth substrate regions defined by the hole pattern;
two first semiconductor chips disposed on a first surface of the package substrate to cross over the first through hole, wherein one of the two first semiconductor chips overlaps the first and second substrate regions and the other of the two first semiconductor chips overlaps the third and fourth substrate regions;
two second semiconductor chips disposed on the two semiconductor chips to cross over the second through hole, wherein one of the two second semiconductor chips overlaps the first and third substrate regions and the other of the two second semiconductor chips overlaps the second and fourth substrate regions;
first bonding wires passing through the first through hole to electrically connect the two first semiconductor chips to the package substrate; and
second bonding wires passing through the second through hole to electrically connect the two second semiconductor chips to the package substrate.

12. The semiconductor package of claim 11,
wherein the first through hole extends in a first direction; and
wherein the second through hole extends in a second direction substantially perpendicular to the first direction.

13. The semiconductor package of claim 11, further comprising:
first chip pads disposed on the two first semiconductor chips to overlap with the first through hole; and
second chip pads disposed on the two second semiconductor chips to overlap with the second through hole,
wherein the first bonding wires are bonded to the first chip pads, and
wherein the second bonding wires are bonded to the second chip pads.

14. The semiconductor package of claim 11,
wherein the package substrate further includes first and second chip connection pads disposed on a second surface of the package substrate opposite to the first and second semiconductor chips; and wherein the first and second bonding wires are bonded to the first and second chip connection pads.

15. The semiconductor package of claim 14, wherein the package substrate further includes:

outer connection pads disposed on the second surface of the package substrate; and outer connection members attached to the outer connection pads, wherein the outer connection pads are electrically connected to the first and second chip connection pads.

16. The semiconductor package of claim 15, wherein the outer connection pads are disposed on the first to fourth substrate regions.

* * * * *